United States Patent
Pagano et al.

(10) Patent No.: US 7,773,445 B2
(45) Date of Patent: Aug. 10, 2010

(54) READING METHOD AND CIRCUIT FOR A NON-VOLATILE MEMORY DEVICE BASED ON THE ADAPTIVE GENERATION OF A REFERENCE ELECTRICAL QUANTITY

(75) Inventors: Giovanni Pagano, Catania (IT); Pierluca Guarino, Rosolini (IT); Edoardo Nocita, Catania (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 224 days.

(21) Appl. No.: 12/031,645

(22) Filed: Feb. 14, 2008

(65) Prior Publication Data

US 2008/0205158 A1 Aug. 28, 2008

(30) Foreign Application Priority Data

Feb. 14, 2007 (IT) .................... TO2007A000109

(51) Int. Cl.
*G11C 7/02* (2006.01)
(52) U.S. Cl. .................. 365/210.12; 365/210.11
(58) Field of Classification Search ........... 365/210.12, 365/210.11, 185.2, 185.21
See application file for complete search history.

(56) References Cited

U.S. PATENT DOCUMENTS 5,673,221 A * 9/1997 Calligaro et al. ............ 365/168
5,889,702 A * 3/1999 Gaultier et al. ............ 365/185.2
6,473,340 B1 * 10/2002 Pasotti et al. ............ 365/185.21
6,697,283 B2 2/2004 Marotta et al.

FOREIGN PATENT DOCUMENTS

EP 1640995 A1 3/2006

* cited by examiner

*Primary Examiner*—Vu A Le
(74) *Attorney, Agent, or Firm*—Lisa K. Jorgenson; Paul F. Rusyn; Graybeal Jackson LLP

(57) ABSTRACT

A circuit for determining the value of a datum stored in an array memory cell of a non-volatile memory device having at least one reference memory cell of known content. The circuit has a determination stage, which compares an array electrical quantity, correlated to a current flowing in the array memory cell, with a reference electrical quantity, and supplies an output signal indicative of the datum, based on the comparison; and a generator circuit, provided with an input receiving a target electrical quantity correlated to a current flowing in use in the reference memory cell, and an output, which supplies the reference electrical quantity with a controlled value close or equal to that of the target electrical quantity. The generator circuit is provided with a variable generator, and a control unit connected to, and designed to control, the variable generator so that it will generate the controlled value of the reference electrical quantity.

36 Claims, 3 Drawing Sheets

READING METHOD AND CIRCUIT FOR A NON-VOLATILE MEMORY DEVICE BASED ON THE ADAPTIVE GENERATION OF A REFERENCE ELECTRICAL QUANTITY

PRIORITY CLAIM

This application claims priority from Italian patent application No. TO2007A 000109, filed Feb. 14, 2007, which is incorporated herein by reference.

TECHNICAL FIELD

Embodiments of the present invention relate to reading methods and circuits for a non-volatile memory device based on the adaptive generation of a reference electrical quantity.

BACKGROUND

As is known, and as illustrated schematically in FIG. 1, a non-volatile memory device 1, for example of a flash type, comprises a memory array 2 having array memory cells 3 arranged in rows and columns. In particular, each array memory cell 3 comprises a floating-gate transistor, and storage of a logic state is performed by programming the corresponding threshold voltage through injection of a quantity of electrical charge in its floating-gate region. In the memory array 2, wordlines (WLs) connect gate terminals of cells set on a same row, and bitlines (BLs) connect drain terminals of cells set on a same column. Individual rows of the memory array are addressed by means of a row decoder 4, which receives at its input an encoded address and biases the wordline of the row each time addressed at a stable and precise voltage, the value of which depends on the type of operation that it is desired to be performed from among reading, verify and modify (programming or erasure).

Individual columns of the memory array are addressed by means of a column decoder 5, which also receives at its input the aforesaid encoded address and biases the bitline of the column each time addressed at a voltage such as to guarantee the presence on the drain terminal of the memory cell of a pre-set electrical potential, which is also stable and controlled. A biasing circuit 6 is connected to the row and column decoders 4, 5, receives a supply voltage VDD, and generates the biasing voltages required for the wordlines WL and the bitlines BL, during the various operating steps of the non-volatile memory device 1. According to the information stored, the array memory cells 3 are distinguished into: erased cells (logic state stored "1"), in the floating-gate region of which no electrical charge is stored; and written or programmed cells (logic state stored "0"), in the floating-gate region of which an electrical charge is stored sufficient to determine a sensible increase in the corresponding threshold voltage. Alternatively, information in the memory cells can be stored with a larger number of bits, to each combination of bits corresponding to a different level of charge stored and a different threshold voltage (so-called "multilevel storage").

Operation of the non-volatile memory device 1 often requires the determination of the content of an array memory cell 3, in particular during operations of reading of the memory content, and of verification of this content after previous modify operations.

The method most widely used for reading the content of an array memory cell 3 envisages the comparison of an electrical quantity correlated to the current flowing through the cell with an analogous electrical quantity correlated to a reference current having a known value. Typically, the reference current flows through a reference memory cell 7, of known content. In a way not illustrated, a plurality of reference memory cells is provided in a non-volatile memory device, each of which is used during reading of a given portion of the memory array. Furthermore, each reference usually is not made by a single cell, but rather by a bank of reference memory cells arranged in rows and columns, in which just one of the cells effectively acts as reference element during reading The other cells surrounding it have the sole purpose of reproducing the same environment that surrounds the array memory cell the content of which is to be read, so that its physical structure becomes as similar as possible to that of the memory cell, thus reducing behavioral differences due, for example, to lithographic aspects of the process. The reference memory cell advantageously experiences the same changes with temperature and/or supply voltage as those experienced by the array memory cells (so that these variations will not lead to reading errors). Moreover, during a single operating step of the memory, a number of reference memory cells, having different current reference values, can be used.

The non-volatile memory device 1 consequently comprises a reading circuit 8, generally known as "sense amplifier", which is connected to the bitlines BL, $BL_{ref}$, respectively, of the array memory cells 3 and of the reference memory cells 7, and carries out the aforesaid comparison for recognizing the data stored in the memory. In particular, to perform reading of an array memory cell 3, a reading voltage is supplied to its floating-gate terminal, by means of the corresponding wordline WL, the reading voltage having a value comprised between the threshold voltage of an erased memory cell and that of a written memory cell. If the memory cell is written, the reading voltage is lower than its threshold voltage, and hence no appreciable current flows. Instead, if the memory cell is erased, the reading voltage is higher than its threshold voltage, and hence an appreciable current flows in the memory cell. This current is then compared with the reference current that flows in the reference memory cell 7, which is appropriately biased by means of the respective reference wordline $WL_{ref}$.

A common drawback in memory devices of the type described above is represented by the fact that biasing of a memory cell for determining its content induces in the cell an electrical stress, which, as time passes, can alter its performance. This problem is aggravated by the continuous technological scaling of electronic devices, which leads to the manufacturing of components with increasingly thinner oxide regions. In particular, repeated accesses to the reference memory cells can lead to considerable shifts of the corresponding threshold voltages, with obvious consequences on the reliability of the reading operations, and/or reduction of their life with possible premature breakage.

This problem is particularly felt in the case of the memory cells used as reference, which, during each reading or modify operation, can be addressed a very high number of times. For example, in a memory sector made up of 2048 columns and 256 rows, with read parallelism ("paral") equal to 64, during a verify operation after erasing (in which, as is known, reference memory cells are selected for verifying correct erasing of array memory cells), a reference memory cell is subjected to a number of accesses N(sector) equal to:

$$N(\text{sector}) = (N_{col} * N_{row})/\text{paral} = (2048*256)/64 = 8192$$

Considering a memory partition of 4 Mb, the number of accesses N(partition) is equal to:

$$N(\text{partition}) = N(\text{sector}) * \text{num\_sectors} = 8192*8 = 65536$$

whilst considering a 64-Mb memory, the number of accesses N(array) is equal to:

N(array)=N(partition)*num_partitions=65536*16=108576

Given that, with technological progress, electronic consumer devices require an increasingly high amount of memory, the number of accesses to which the reference cells are subjected is bound to further increase.

In addition, size reduction of memory cells also leads to an aggravation of problems linked to charge retention within oxide layers and, in particular, of the phenomenon of random shift of the threshold voltage or Random Threshold Shift ("RTS"). For example, tests performed by the present applicant have demonstrated instability of the reference threshold in the memory cells of up to 300 mV. Such a variability can clearly lead to errors in the determination of the stored information.

On account of the aforesaid problems, it has consequently become necessary to revise the methodology of use of memory cells as stable and durable current references.

There has, for example, been proposed the use of reference-current generators instead of reference memory cells. This solution does not, however, enable the natural variations of the array memory cells with temperature and/or supply voltage to be followed.

For the above reason, the use of a reference-current generator has been proposed, that is able to adapt to variations of temperature and supply voltage in so far as it comprises a resistive element that is variable as a function of these parameters. However, the resistive component, by its very nature, does not have a characteristic of variability identical to that of an array memory cell, making the proposed circuit difficult to implement.

In another approach, a reading circuit for a non-volatile memory device has been proposed, provided with a sample-and-hold stage, in particular comprising a storage capacitor, for detecting and maintaining a sample of a reference voltage correlated to the reference current flowing in a reference memory cell. Accordingly, access to the reference memory cell is limited to just the time necessary for the capacitor to charge to the reference voltage, after which the cell is deselected, and reading operations proceed using the reference voltage held by the capacitor. A solution of this sort, although advantageous in so far as it limits access to the reference memory cells and the consequent electrical stress, is not, however, free from problems. In particular, the voltage maintained by the storage capacitor is subject to a natural reduction over time, on account of the capacitor discharge through leakage current, so that the reference voltage is not perfectly stable Also, it is necessary to refresh periodically the charge stored in the capacitor, by accessing again the reference memory cell. Each refresh operation, in addition to causing an electrical stress in the reference cell, is exposed to the problem of random threshold shift (RTS) of the cell, thus further contributing to the non-perfect stability of the reference voltage.

SUMMARY

Embodiments of the present invention provide a circuit and a method for reading the content of an array memory cell based on the generation of a reference current, which will constitute an improvement in the known art and will enable at least some of the aforesaid problems and disadvantages to be overcome, in particular limiting electrical stresses to which reference memory cells are subjected, and at the same time accurately following variations in temperature and/or supply of the array memory cells.

BRIEF DESCRIPTION OF THE DRAWINGS

For a better understanding of the present invention, embodiments thereof are now described, purely by way of non-limiting example and with reference to the attached drawings, wherein.

DETAILED DESCRIPTION

The following discussion is presented to enable a person skilled in the art to make and use the invention Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

As will be clarified in what follows, one embodiment of the present invention envisages generating, by use of a variable current generator, an active current reference that follows precisely the variations (for example, in temperature and/or with the supply voltage) undergone by the array memory cells during operation of a non-volatile memory device.

Figure 1:
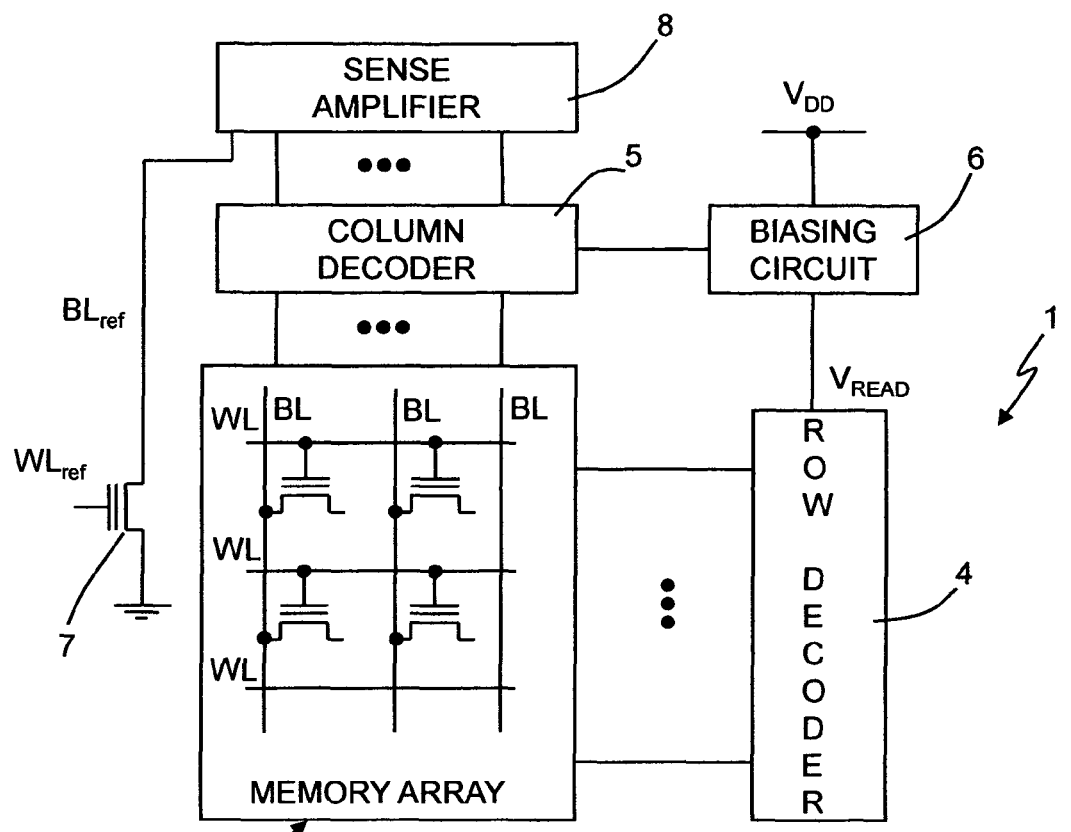
FIG. 1 is a schematic illustration of the circuit architecture of a conventional non-volatile memory device.
Figure 2:
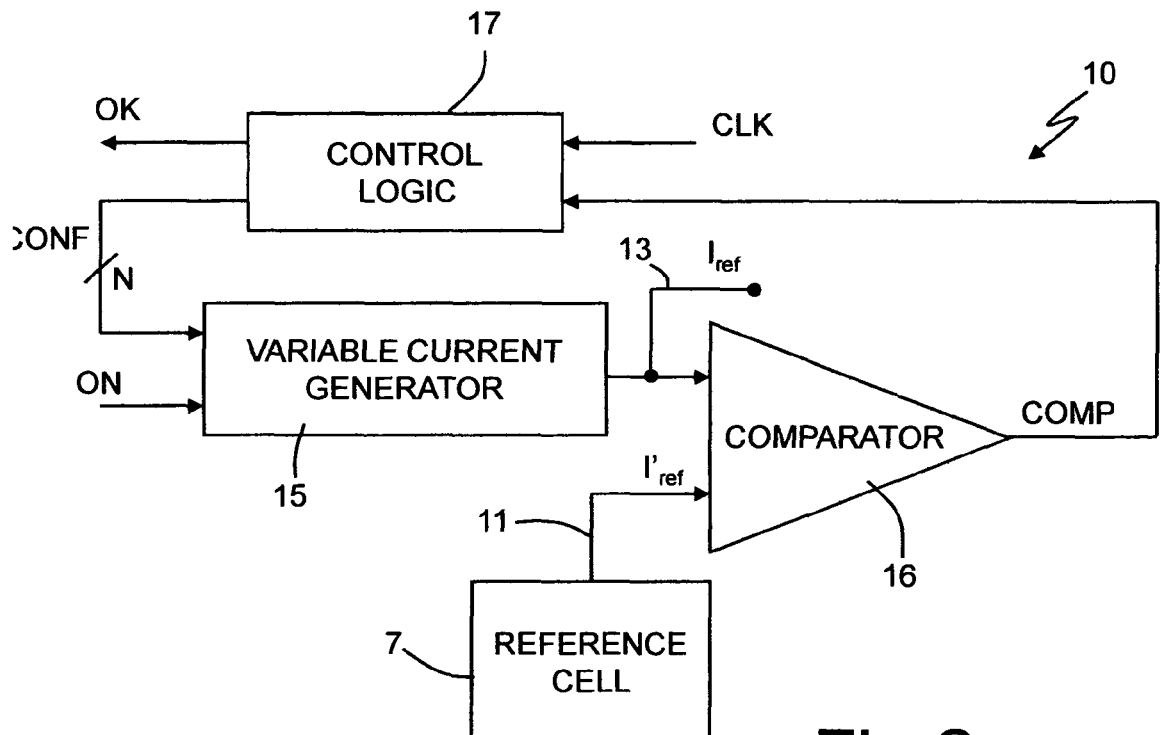
FIG. 2 shows a circuit block diagram of an adaptive reference-current generator according to one embodiment of the present invention.

In detail, and as illustrated in FIG. 2, an adaptive reference-current generator circuit, designated as a whole by 10, has a first input 11, connected to a reference memory cell 7 of known content, and receiving a reference-cell current $I'_{ref}$ flowing in use through the reference memory cell; and a first output 13, designed to supply a reference current $I_{ref}$ that will follow closely the reference-cell current $I'_{ref}$, and usable, as will be described hereinafter, by a determination circuit for determining data stored in array memory cells of a non-volatile memory device. The reference-cell current $I'_{ref}$ is affected, in a known way, by boundary conditions, and in particular by the variations in temperature and/or supply voltage.

The generator circuit 10 further comprises: a variable current generator 15; a current comparator stage 16; and a control logic 17. The variable current generator 15, for example comprising a digital-to-analog converter (DAC), receives at an input a digital configuration word CONF (constituted by a number N of bits) and a turn-on signal ON, and supplies on the first output 13 the reference current $I_{ref}$ having a value that is a function of the digital configuration word CONF. The current comparator stage 16, of an analog type, has: a first input terminal connected to the output of the variable current generator 15 and thus receiving the reference current $I_{ref}$ generated thereby; a second input terminal connected to the first input 11 and hence receiving the reference-cell current $I'_{ref}$; and an output terminal supplying a comparison signal COMP having a first logic value (for example, high) when the reference current $I_{ref}$ is higher than the reference-cell current $I'_{ref}$, and a second logic value (in the example, low) otherwise. The control logic 17 receives at an input a clock signal CLK from a clock circuit (not illustrated), and the comparison signal COMP from the current comparator stage 16, and supplies at an output, according to the comparison signal and using an appropriate algorithm of an iterative type, a new digital control word CONF for the variable current generator 15, which has an appropriate bit configuration. The control logic 17 also supplies at an output a confirmation signal OK, of a logic type.

Figure 3:
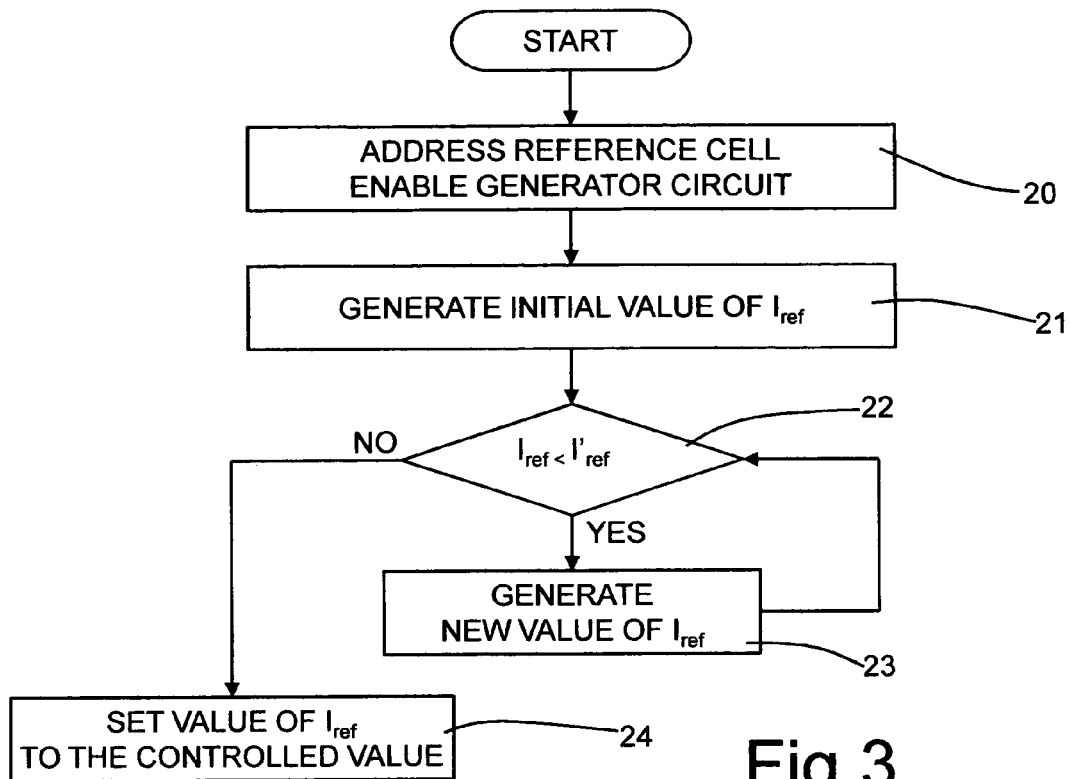
FIG. 3 shows a flowchart for the generation of a reference current by the generator of FIG. 2.

Operation of the generator circuit 10 for generation of the reference current $I_{ref}$ that is close to the reference-cell current $I'_{ref}$ is now described with reference to FIG. 3.

In detail, an initial block 20 refers to the start of a given operating step of the non-volatile memory device, in which it is necessary to determine the content of array memory cells using a reference memory cell. The reference memory cell 7 is addressed by applying on the floating-gate terminal a voltage of appropriate value (according, for example, to an operating condition of the memory), so that the reference-cell current $I'_{ref}$ will flow therethrough, and the turn-on signal ON is also supplied to the generator circuit 10

The variable current generator 15 consequently generates (block 21) a first value of the reference current $I_{ref}$, equal for example to a minimum value, based on an initial value of the digital configuration word CONF, and the current-comparison stage 16 compares this first value with the reference-cell current $I'_{ref}$.

If (block 22) the value of the reference current $I_{ref}$ is lower than the value of the reference-cell current $I'_{ref}$, the comparison signal COMP has a low value, and the control logic 17 supplies at its output a new value of the digital configuration word CONF so that the variable current generator 15 will generate a new value of the reference current $I_{ref}$ higher than the first value previously generated (block 23). For example, the control logic 17 can iteratively send commands for incrementing with a constant step the reference current $I_{ref}$ starting from the initial minimum value. This is followed by a return to block 22 for comparison of the new value with the reference-cell current $I'_{ref}$.

If, instead, the reference current $I_{ref}$ is higher than or equal to the reference-cell current $I'_{ref}$, the comparison signal COMP switches to the high value, and the control logic 17 thus stops variation of the reference current $I_{ref}$, which remains set at the controlled value that is closest (and possibly equal) to that of the current that actually flows in the reference cell 12 (block 24). At the same time, the control logic 17 generates at the output the confirmation signal OK, having a high value, so as to signal to a control stage driving the memory device that a stable and controlled value of the reference current $I_{ref}$ has been reached. From this moment on, the reference memory cell 7 may thus be deselected, hence preventing any further access, and the reference current $I_{ref}$ may be used for the operations of determination of the data stored in the memory, at least up to the end of the current operating step of the memory device.

Figure 4:
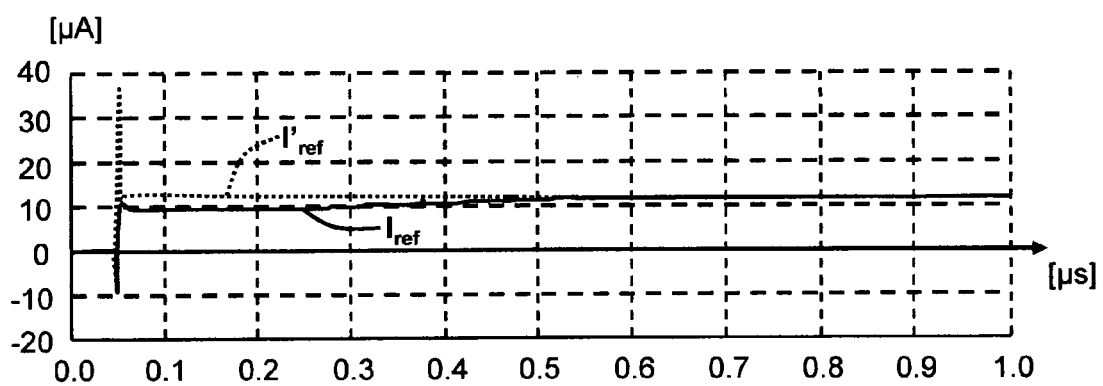
FIG. 4 is a graph of electrical quantities associated with the generator of FIG. 2.
Figure 4:
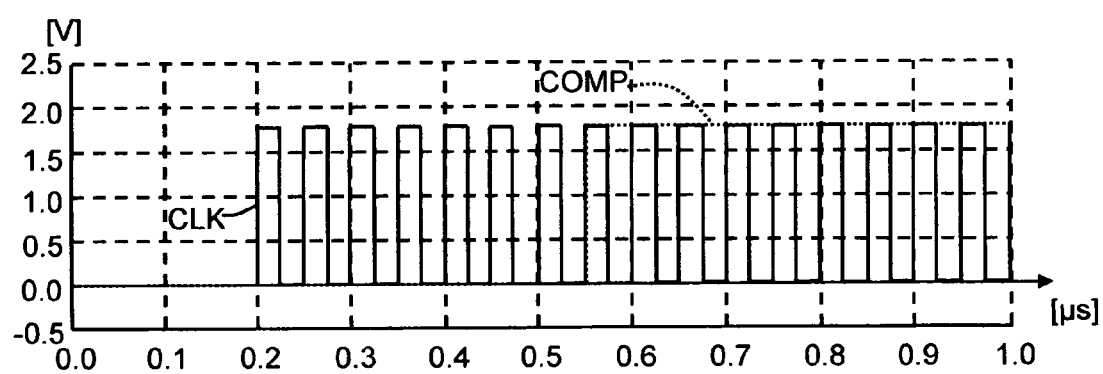

As illustrated in FIG. 4, the reference current $I_{ref}$ generated by the variable current generator 15 is iteratively incremented at each cycle of the clock signal CLK, for example with a step of increment having a constant value, until it reaches (or exceeds) the value of the reference-cell current $I'_{ref}$. After the comparison signal COMP switches to the high value, the reference current $I_{ref}$ remains set stably at the value previously reached (corresponding to the current configuration of the digital configuration word CONF). Evidently, it is possible to adjust the step of increment of the reference current, to adjust the speed at which the reference current $I_{ref}$ reaches the value of the reference-cell current $I'_{ref}$, and also the precision with which the reference current $I_{ref}$ follows the reference-cell current $I'_{ref}$.

Figure 5:
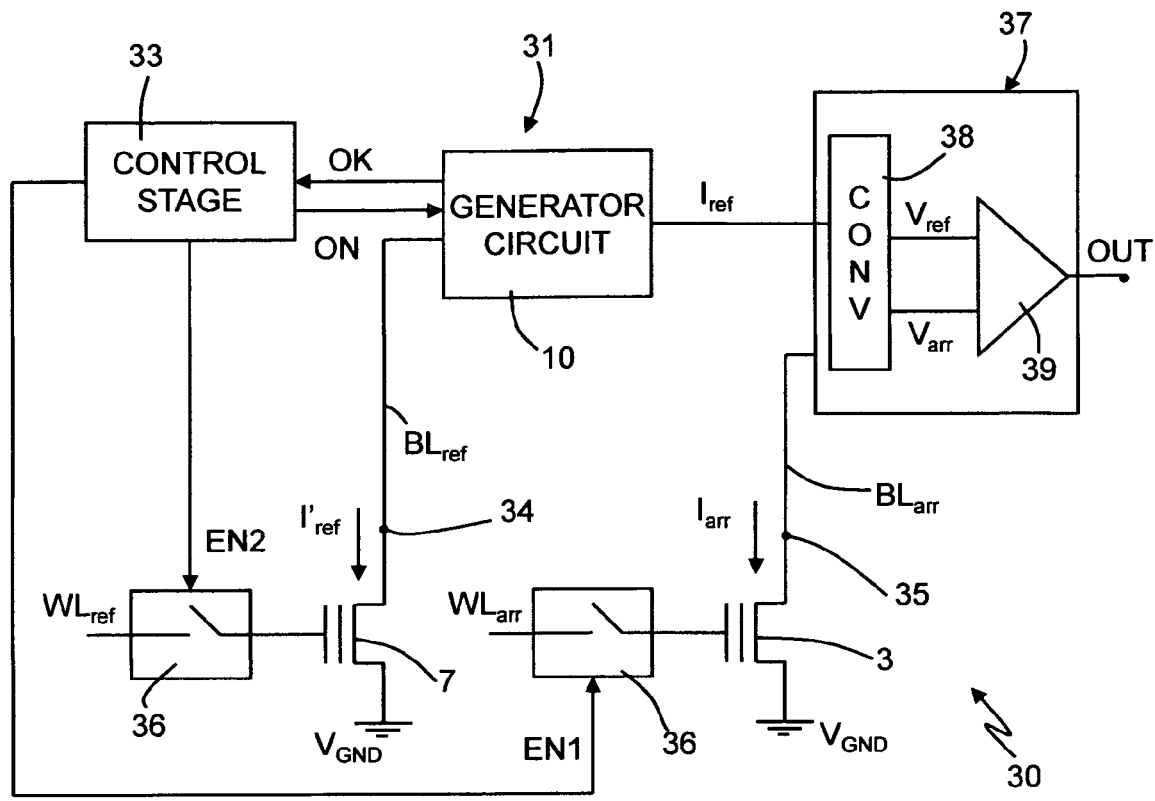
FIG. 5 is a schematic illustration of a circuit for determining the value of a datum stored in an array memory cell of a non-volatile memory device including the adaptive reference-current generator of FIG. 2.

FIG. 5 is a schematic illustration of a possible architecture of a non-volatile memory device 30, comprising: a determination circuit 31 for determining the value of data stored in the array memory cells 3 (FIG. 5 shows just one cell, for reasons of simplicity of illustration); and a control stage 33, provided, for example, with a microprocessor circuit.

In detail, the determination circuit 31 has a reference input 34, connected, through a reference bitline $BL_{ref}$, to one (or more) reference memory cells 7 (FIG. 5 shows just one cell, for reasons of simplicity of illustration), and an array input 35, connected, through an array bitline $BL_{arr}$, to an array memory cell 3. In particular, the array memory cell 3 and the reference memory cell 7 have gate terminals connected to an array wordline $WL_{arr}$ and to a reference wordline $WL_{ref}$, respectively, through the interposition of respective controlled switches 36, receiving respective enabling signals EN1, EN2 from the control stage 33; drain terminals connected to the array bitlines $BL_{arr}$ and reference bitlines $BL_{ref}$, respectively, and supplying in use an array current $I_{arr}$ and the reference-cell current $I'_{ref}$; and source terminals connected to a ground potential $V_{GND}$ of the circuit.

The determination circuit 31 further comprises: the generator circuit 10 described previously, having the first input 11 (here not illustrated) connected to the reference bitline $BL_{ref}$ and receiving the reference-cell current $I'_{ref}$; and a sense-amplifier stage 37, having a respective first input connected to the first output 13 (here not illustrated) of the generator circuit 10, and a respective second input connected to the array bitline $BL_{arr}$. In greater detail, the sense-amplifier stage 37 comprises: a converter stage 38, designed to convert the reference current $I_{ref}$ and the array current $I_{arr}$ that it receives at an input into a reference voltage $V_{ref}$ and an array voltage $V_{arr}$, respectively; and a comparator stage 39, of a differential type, designed to compare the reference voltage $V_{ref}$ and the array voltage $V_{arr}$, and to generate at an output a signal OUT indicative of the value of the data stored in the array memory cell 3 that is being read.

At the start of an operating step of the memory device 30 in which it is necessary to determine the content of the array memory cells 3 (for example, at the start of a verify step after writing, either during programming or erasure, which follows in a known way the writing step), the control stage 33 initially activates the generator circuit 10 via the turn-on signal ON, and addresses the reference memory cell 7 via the respective enabling signal EN2 The array memory cell 3 for the moment is not addressed. Then the generator circuit 10, as described previously, generates a reference current $I_{ref}$ having a value close to the current effectively circulating in the selected reference memory cell 7. Once this current has reached a stable and controlled value (the confirmation signal OK switches to the high value), the reference memory cell 7 is deselected. Next, during the entire operating step (in the example, the verify step), the content of the individual array memory cells 3, each time selected via the respective enabling signal EN1, is determined by comparing the current flowing therein, not with the current flowing in the reference memory cell, but with the reference current $I_{ref}$ generated by the generator circuit 10. Consequently, the advantage of the solution proposed, according to which the reference memory cell 7 is accessed just once during an entire operating step of the memory device, appears immediately evident. In actual fact, given that an operating step can be divided into a number of substeps, for example, an erasure operation generally includes a number of operative substeps (known, for example, as ALL0, ERASE, SOFTP), the value of the reference current $I_{ref}$ will be set at the start of each new substep using the reference cell purposely provided for this substep (in particular, for the writing substeps referred to: respectively, the programming reference cell, the erasure reference cell, and the depletion reference cell). Updating of the reference current can also be performed when resuming after a suspension of the modify step.

The advantages afforded by the circuit and method according to various embodiments of the invention are clear from the foregoing description.

In any case, it is emphasized that minimization of the number of accesses to reference memory cells is provided (which are biased just in a short time interval at the start of each operating step, or substep, of the memory), in this way reducing the electrical stress to which they are subjected and considerably increasing their life. At the same time, the reference current $I_{ref}$ generated is close (or equal) to the current that flows in the reference cells, of which it reproduces the variations in temperature and/or supply voltage. Accessing the memory cells just once for each operating step (or substep) also enables reduction in the negative consequences of the phenomenon of random threshold-voltage shift. Furthermore, embedded triggering of the current generator enables a correct temperature tracking, in so far as generation of the reference current does not occur just once (for example, at turn-on of the device), but rather is repeated at the start of each operating step in the memory array. In this way, the reference cell 7 is sampled at the temperature of start of operation. Since the duration of the longest operating step (erasure) of approximately 700 ms, and the memory is installed on systems that do not undergo, in their normal use, sudden changes of temperature, the temperature can reasonably be assumed as constant throughout the operating step.

Basically, the reference-current generator circuit enables the functionality of the memory device to be kept unaltered, with a limited access to the reference memory cells.

The circuit described is moreover simple and inexpensive to manufacture and has a minimum encumbrance, which renders its insertion in the layout of non-volatile memory devices simple.

Figure 6:
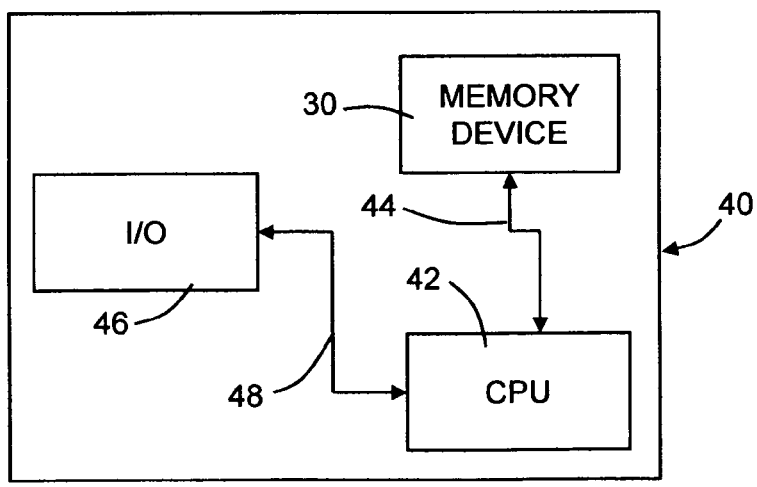
FIG. 6 shows a schematic block diagram of an electronic apparatus incorporating a non-volatile memory device including the circuit of FIG. 5 and adaptive reference-current generator of FIG. 2.

Embodiments of the embodiments of present invention described above are particularly advantageous for use in an electronic apparatus 40 (FIG. 6) of a portable type, for example a mobile phone, a PDA, a palmtop or portable computer, a digital audio player, a remote control, a video camera or photo camera, etc., that comprises: a non-volatile memory device 30 (of the type described previously); a microprocessor control unit 42, connected to the non-volatile memory device 30 via a first data bus 44, and designed to supervise general operation of the electronic apparatus 40; and input/output devices 46, connected to the microprocessor control unit 42 via a second data bus 48

Finally, it is clear that modifications and variations can be made to what is described and illustrated herein, without thereby departing from the scope of the present invention, as defined in the annexed claims.

in particular, it is again emphasized that embodiments of the present invention can be applied advantageously during the operations of erasure of the memory (where there are greater time margins, which enable setting of the reference current), but also during other memory operations, such as programming, soft-programming, verify, and reading. In particular, at the start of an operating step of reading of the memory, until the stable value of the reference current $I_{ref}$ is set, the sense-amplifier stage 37 could be connected, by means of appropriate switching elements (not illustrated), directly to the reference memory cell 7 and to the corresponding reference bitline $BL_{ref}$, and only subsequently be connected to the output of the generator circuit 10 (in this way preventing any delay in the reading operations). Reading would thus be performed based on the reference-cell current $I'_{ref}$ in an initial step (in which the reference cell 7 is addressed) and on the reference current $I_{ref}$ generated by the generator circuit 10 for the remaining part of the operating step (in which the reference cell is deselected, so as to reduce the electrical stress, as described previously). Furthermore, the control logic 17 in the generator circuit 10 could use a different iterative algorithm for generation of the reference current $I_{ref}$. For example, the initial value generated could be equal to a maximum generatable value, and the subsequent values could be decremented by a constant step until the value closest (or equal) to the reference-cell current $I'_{ref}$ is reached (switching to the low state of the current comparator 16, in this case stopping the generator circuit 10). Alternatively, in order to cause the reference current $I_{ref}$ to reach the reference-cell current $I'_{ref}$ more rapidly, an algorithm of a dichotomic type for scanning the values of the reference current could be used. In a per-se known manner, the algorithm could initially envisage setting to 1 the most significant bit of the digital configuration word CONF, and comparing the reference current thus obtained (equal to half of the maximum generatable current) with the current of the reference cell. According to the result of the comparison, the second most significant bit could then be set to 1 (bringing the most significant bit back to 0 or keeping it at 1), and the comparison be repeated, and so forth until the value of all the bits of the digital configuration word CONF are identified (assignment of the value of the least significant bit in this case indicating that an adjusted stable value of the reference current $I_{ref}$ has been reached).

Furthermore, it is not strictly necessary for the biasing conditions of the reference memory cell 7 and of the array memory cell 3 to be identical. A virgin reference memory cell could consequently be used, or one with a threshold voltage that is different from the one that usually divides the distributions (obviously it will be necessary in this case to have an optimal control and reproducibility in the generation of the biasing voltages in the reading step, given that they will not be applied simultaneously to the memory array and to the references) It may also be possible to use a single reference cell to generate a reference current for all the memory operations (possibly to be biased in different conditions if different current reference values are necessary for the different operations), or else for the various levels, in the case of multilevel storage. Alternatively, the various levels of reference current could be obtained starting from a single generated level, either by translation or by mirroring.

Finally, to further reduce the effects of random threshold shift (RTS), the generator circuit 10 could use for each operative step/substep, instead of a single reference memory cell 7, a set of reference cells read in parallel, the current of which is appropriately averaged so that the random shift on one of them will have a negligible impact, it being, at least to a first approximation, extremely unlikely for the random shift to occur simultaneously on a significant number of cells.

From the foregoing it will be appreciated that, although specific embodiments of the invention have been described herein for purposes of illustration, various modifications may be made without deviating from the spirit and scope of the invention.

The invention claimed is:

1. A circuit for determining the value of a datum stored in an array memory cell of a non-volatile memory device having at least one reference memory cell of known content, the circuit comprising:
   a comparison stage configured to compare an array electrical quantity, correlated to a current flowing in said array memory cell, with a reference electrical quantity, and to supply an output signal, indicative of said datum, based on said comparison; and
   a generator circuit, having an input designed to receive a target electrical quantity correlated to a current flowing in use in said reference memory cell, and an output designed to supply said reference electrical quantity with a controlled value that is a function of said target electrical quantity;
   wherein said generator circuit comprises a variable generator, and a control unit connected to, and configured to control, said variable generator so that it will generate said controlled value of said reference electrical quantity.

2. The circuit according to claim 1, wherein said generator circuit is configured to supply, once generated, said controlled value of said reference electrical quantity in a stable way over time in the absence of said target electrical quantity on said input.

3. The circuit according to claim 1, wherein said target electrical quantity is said current flowing in said reference memory cell, said reference electrical quantity is a current with value at least close to that of said target electrical quantity, and said variable generator is a controlled current generator.

4. The circuit according to claim 1, wherein said variable generator has an input terminal designed to receive a control variable from said control unit, and an output terminal designed to supply, on said output, a value of said reference electrical quantity generated according to said control variable; said control unit being configured to determine an appropriate value of said control variable so that said generated value will be equal to said controlled value of said reference electrical quantity.

5. A circuit for determining the value of a datum stored in an array memory cell of a non-volatile memory device having at least one reference memory cell of known content, the circuit comprising:
   a comparison stage configured to compare an array electrical quantity, correlated to a current flowing in said array memory cell, with a reference electrical quantity, and to supply an output signal, indicative of said datum, based on said comparison;
   a generator circuit, having an input designed to receive a target electrical quantity correlated to a current flowing in use in said reference memory cell, and an output designed to supply said reference electrical quantity with a controlled value that is a function of said target electrical quantity;
   wherein said generator circuit comprises a variable generator, and a control unit connected to, and configured to control, said variable generator so that it will generate said controlled value of said reference electrical quantity;
   wherein said variable generator has an input terminal designed to receive a control variable from said control unit, and an output terminal designed to supply, on said output, a value of said reference electrical quantity generated according to said control variable; said control unit being configured to determine an appropriate value of said control variable so that said generated value will be equal to said controlled value of said reference electrical quantity; and
   a comparator stage, connected to said input and to said output terminal of said variable generator, and configured to carry out a comparison between the value of said target electrical quantity and said generated value, and supply at an output a comparison signal; said control unit being configured to receive said comparison signal and to determine iteratively a new value of said control variable on the basis of said comparison signal, until said generated value is equal to said controlled value of said reference electrical quantity.

6. The circuit according to claim 5, wherein said control unit is configured to generate iteratively a succession of values of said control variable, so that said variable generator will reach said controlled value of said reference electrical quantity by successive approximations starting from an initial value.

7. The circuit according to claim 6, wherein said control unit is configured to control successive variations with constant variation step of the generated value of said reference electrical quantity, until said controlled value is reached.

8. The circuit according to claim 6, wherein said control unit is configured to determine successive variations of the generated value of said reference electrical quantity by means of a dichotomic algorithm until said controlled value is reached.

9. The circuit according to claim 1, wherein said controlled value is substantially equal to that of said target electrical quantity.

10. The circuit according to claim 1, having a first input terminal designed to be connected to said array memory cell for receiving said array electrical quantity, and a second input terminal designed to be connected to said reference memory cell for receiving said target electrical quantity; said generator circuit being set between said second input terminal and a first terminal of said determination stage, a second terminal of said determination stage being connected directly to said first input terminal.

11. A non-volatile memory device, comprising at least one reference memory cell of known content, and an array memory cell the content of which is to be determined, further comprising a circuit for determining the value of a datum stored in said array memory cell, according to claim 1.

12. The device according to claim 11, further comprising a control stage connected to said circuit, and configured to supply an enabling command to said reference memory cell until said reference electrical quantity assumes said controlled value, and to supply a disabling signal to said reference memory cell when said reference electrical quantity assumes said controlled value, in response to a logic confirmation signal received by said circuit, so as to disconnect said reference memory cell from said input of said circuit.

13. The device according to claim 12, wherein said control stage is configured to supply said enabling command at least in an initial step of an operating mode of said non-volatile memory device chosen between a reading mode, a verify mode, a programming mode, and an erasure mode.

14. An electronic apparatus, comprising a non-volatile memory device according to claim 11.

15. The apparatus according to claim 14, being of a portable type, chosen in the group comprising: a mobile phone, a PDA, a palmtop computer, a portable computer, a digital audio player, a remote control, a video camera or photo camera.

16. A method for determining the value of a datum stored in an array memory cell of a non-volatile memory device having at least one reference memory cell of known content, comprising the steps of acquiring a target electrical quantity correlated to a current flowing in use in said reference memory cell, and generating a reference electrical quantity with a controlled value that is a function of that of said target electrical quantity, and the steps of comparing an array electrical quantity, correlated to a current flowing in said array memory cell, with said reference electrical quantity, so as to supply an output signal indicative of said datum, based on said comparison; wherein said step of generating comprises controlling a variable generator on the basis of said target electrical quantity so that it will generate said controlled value of said reference electrical quantity.

17. The method according to claim 16, wherein said target electrical quantity is said current flowing in said reference memory cell, said reference electrical quantity is a current with a value at least close to that of said target electrical quantity, and said variable generator is a controlled current generator.

18. The method according to claim 16, wherein said variable generator is configured to supply at output a generated value of said reference electrical quantity according to a control variable received at an input; said step of controlling said generator comprising determining an appropriate value of said control variable such that said generated value will be stably equal in time to the controlled value of said reference electrical quantity.

19. The method according to claim 18, wherein said step of controlling said generator comprises comparing the value of said target electrical quantity with said generated value of said reference electrical quantity, and determining iteratively a new control variable for said variable generator based on the result of said comparison, until said generated value is equal to said controlled value of said reference electrical quantity.

20. The method according to claim 19, wherein said step of controlling said generator comprises generating iteratively a succession of values of said control variable so that said variable generator reaches said controlled value of said reference electrical quantity by successive approximations starting from an initial value; each new value of said control variable being determined as a function of the comparison signal between the value previously generated of said reference electrical quantity and the value of said target electrical quantity.

21. The method according to claim 20, wherein said step of controlling said generator comprises determining successive variations with constant variation step of the value of said reference electrical quantity, until said controlled value is reached.

22. The method according to claim 20, wherein said step of controlling said generator comprises determining successive variations of the value of said reference electrical quantity by means of a dichotomic algorithm, until said controlled value is reached.

23. The method according to claim 16, comprising the steps of supplying an enabling command to said reference memory cell until said reference electrical quantity assumes said controlled value, and of supplying a disabling signal once said controlled value of said reference electrical quantity has been generated, disconnecting said reference memory cell.

24. The method according to claim 23, comprising supplying said enabling command at least in an initial step of an operating mode of said non-volatile memory device; said operating mode being one from among a reading mode, a verify mode, a programming mode, and an erasure mode.

25. A generator circuit for generating a reference electrical quantity in a circuit for determining the value of a datum stored in an array memory cell in a non-volatile memory device, according to claim 1.

26. An adaptive reference-current generating circuit, comprising:
    a comparing circuit adapted to receive on a first input a first reference current corresponding to the current flowing through a reference memory cell, and to receive a controlled reference current on a second input, and operable to generate an output signal responsive to this comparison;
    a variable current generating circuit operable responsive to a digital confirmation word to generate the controlled reference current, the controlled reference current having a value that is a function of the value of the digital confirmation word; and
    a control circuit coupled to the comparing circuit and to the variable voltage current generating circuit, the control circuit operable to generate the digital confirmation word and to generate a locked signal, the digital confirmation word having a value that is a function of the output signal from the comparison circuit and the locked signal, when active, indicating the controlled reference current signal has a desired value.

27. The adaptive reference-current generating circuit of claim 26, wherein the control circuit is further operable to generate an enable signal adapted to control generation and termination of the reference current.

28. The adaptive reference-current generating circuit of claim 26, wherein the variable current generating circuit comprises a digital-to-analog converter.

29. An adaptive reference-current generating circuit, comprising:
    a comparing circuit adapted to receive on a first input a first reference current corresponding to the current flowing through a reference memory cell, and to receive a controlled reference current on a second input, and operable to generate an output signal responsive to this comparison;
    a variable current generating circuit operable responsive to a digital confirmation word to generate the controlled reference current, the controlled reference current having a value that is a function of the value of the digital confirmation word; and
    a control circuit coupled to the comparing circuit and to the variable voltage current generating circuit, the control circuit operable to generate the digital confirmation word and to generate a locked signal, the digital confirmation word having a value that is a function of the output signal from the comparison circuit and the locked signal, when active, indicating the controlled reference current signal has a desired value;
    wherein the control circuit is operable to sequentially increment the value of the digital confirmation word and to activate the locked signal when the value of the controlled reference current is greater than the value of the reference current.

30. A memory device, comprising:
    an array of memory cells, each memory cell being configured to be coupled to an associated bit line and an associated word line;

a reference memory cell being coupled to an associated reference bit line and a reference word line;

an adaptive reference-current generating circuit coupled to the reference bit line, comprising, a comparing circuit including a first input coupled to the reference bit line to receive a first reference current corresponding to the reference current flowing through the reference memory cell, and including a second input to receive a controlled reference current, the comparing circuit operable to generate an output signal responsive to this comparison;

a variable current generating circuit operable responsive to a digital confirmation word to generate the controlled reference current, the controlled reference current having a value that is a function of the value of the digital confirmation word; and a control circuit coupled to the comparing circuit and to the variable voltage current generating circuit, the control circuit operable to generate the digital confirmation word and to generate a locked signal, the digital confirmation word having a value that is a function of the output signal from the comparison circuit and the locked signal, when active, indicating the controlled reference current signal has a desired value;

a control stage coupled to the reference memory cell, the word lines of the array of memory cells, and the variable current generating circuit of the adaptive reference-current generating circuit, the control stage operable to apply a signal on the reference word line to activate the reference memory cell and, in response to the locked signal going active, operable to apply the signal on the reference word line to deactivate the reference memory cell, and the control stage further operable to apply signals on selected word lines of the array to active selected memory cells; and a sense amplifier coupled to the bit lines of the array of memory cells and to the variable current generating circuit of the adaptive reference-current generating circuit to receive the controlled reference current, the sense amplifier operable to compare an array current flowing a selected memory cell coupled to the corresponding bit line of the array to the controlled reference current, and operable responsive to this comparison to generate a data output signal indicating the value of data stored in the selected memory cell.

31. The memory device of claim 30, wherein the sense amplifier is further coupled to the reference bit line, and wherein the sense amplifier is operable to compare the array current to the reference current prior to the locked signal going active and, once the locked signal goes active, the sense amplifier operable to compare the array current to the controlled reference current.

32. The memory device of claim 30, wherein the memory device comprises a nonvolatile memory device.

33. The memory device of claim 32, wherein the nonvolatile memory device comprises a flash memory device.

34. A method for sensing the data stored in a memory cells of a memory-cell array, the method comprising:

generating a reference current using at least one reference memory cell;

generating a controlled reference current using electronic circuitry that does not include a memory cell;

comparing the value of the reference current to the value of the controlled reference current;

changing the value of the controlled reference current responsive to the comparison;

repeating the operations of comparing and changing until the controlled reference current has a determined value relative to the reference current;

locking the controlled reference current at its current value when the controlled reference current has the determined value relative to the reference current;

terminating the generating of the reference current once the controlled reference current has the determined value relative to the reference current; and comparing the controlled reference current to the current through selected memory cells in the memory-cell array to sense the data stored in these selected memory cells.

35. The method of claim 34, wherein generating the controlled reference current includes generating a digital word and wherein changing the value of the controlled reference current includes changing the value of the digital word responsive to comparing the value of the reference current to the value of the controlled reference current.

36. The method of claim 34, further comprising comparing the reference current to the current through selected memory cells in the memory-cell array to sense the data stored in these selected memory cells prior to the controlled reference current being locked at its current value when the controlled reference current has the determined value relative to the reference current.

* * * * *